United States Patent [19]
Leeb et al.

[11] Patent Number: 5,837,086
[45] Date of Patent: Nov. 17, 1998

[54] METHOD OF INJECTION-MOULDING PLASTICS FOR ELECTRICAL SHIELDING CASINGS

[75] Inventors: Karl-Erik Leeb, Lillebo; Lars Persson, Vinslov, both of Sweden

[73] Assignee: Telefonaktiebolaget LM Ericsson, Stockholm, Sweden

[21] Appl. No.: 750,619

[22] PCT Filed: Jun. 8, 1995

[86] PCT No.: PCT/SE95/00688

§ 371 Date: Dec. 13, 1996

§ 102(e) Date: Dec. 13, 1996

[87] PCT Pub. No.: WO95/34423

PCT Pub. Date: Dec. 21, 1995

[30] Foreign Application Priority Data

Jun. 14, 1994 [SE] Sweden ................................ 9402084

[51] Int. Cl.⁶ .................................................. H05K 13/00
[52] U.S. Cl. ...................... 156/245; 264/272.11; 156/292
[58] Field of Search .............................. 264/272.17, 511, 264/512, 513, 515, 272.11; 257/678, 701, 702; 156/245, 244.13, 145, 292

[56] References Cited

U.S. PATENT DOCUMENTS

| 4,639,341 | 1/1987 | Hanamoto et al. ................. 264/513 X |
| 5,435,746 | 7/1995 | Leeb ........................................ 439/387 |
| 5,501,008 | 3/1996 | Leeb ........................................ 29/849 |

FOREIGN PATENT DOCUMENTS

| 0534185 A1 | 3/1993 | European Pat. Off. . |
| 60-129224 | 10/1985 | Japan . |
| 61-197221 | 9/1986 | Japan . |
| WO94/22181 | 9/1994 | WIPO . |

OTHER PUBLICATIONS

International Search Report mailed Sep. 27, 1995 corresponding to International Application No. PCT/SE 95/00688.

Dialog Information Services, File 351, Derwent WPI, Dialog accession No. 004379201, WPI accession No. 85-206079/34, Showa Denko KK: "Housing material for shielding electromagnetic radiation is prepd. by laminating metal membrane with thermoplastic resin, inserting in mould and injecting with thermo-plastic resin", JP 60129224, A, 850710, 8534 (Basic).

Patent Abstracts of Japan, vol. 11, No. 356, M-644, Abstract of JP A, 62-135332 (Mitsubishi Monsanto Chem. Co.), Jun. 18, 1987.

*Primary Examiner*—Francis J. Lorin
*Attorney, Agent, or Firm*—Burns, Doane, Swecker, Mathis, L.L.P.

[57] ABSTRACT

The present invention relates to a method of injection-molding electrically shielding electronic casings, where a laminate that comprises at least one metal foil and at least one plastic layer is held stretched in an injection-molding tool. According to the invention, a plastic structure is molded in the tool on that side of the laminate which comprises the plastic layer, wherewith the laminate is deep-drawn in the tool and formed therein as the plastic material is injected thereinto and the plastic layer adheres to the plastic structure, therewith forming a molded plastic element which includes an integrated and uniformly distributed and therewith shielding metal layer.

13 Claims, 3 Drawing Sheets

METHOD OF INJECTION-MOULDING PLASTICS FOR ELECTRICAL SHIELDING CASINGS

BACKGROUND

The present invention relates to a method of injection-moulding plastic elements that will shield against electromagnetic fields of radio frequencies.

In the mass-production of electronics, technical problems often arise in shielding different electronic components so that their functions will not alternate through the effect of high-frequency electromagnetic fields, and so that their functions will not alternate with the functions of other electronic apparatus or be disturbed by surrounding electric apparatus. There is also often the need to produce the electronics cheaply and in a simple manner.

Several different methods of manufacturing shielding casings are known to the art. For instance, the casings may be cast in metal, pressed from sheet metal, cast in plastic that includes an electrically conductive filler, or cast in plastic that is covered with a metal-plated layer.

One problem with all of these methods resides in the provision of joints at those locations where the disparate parts of the casing are contacted with one another, which is a prerequisite for achieving effective screening, particularly in the case of high frequencies or in the case of data signals that have short rise and fall times. Damping requirements are very high, particularly in radio constructions for telecommunications. In the case of the aforesaid plastic-moulding methods, the problem arises of obtaining uniform distribution of effective electrical conductivity. With regard to metallized layers, there is often a problem of providing a metal layer of sufficient thickness in all parts of the construction, with regard to the depth to which electric current will penetrate at the frequency concerned. Furthermore, the application of metal plating to plastic surfaces is a relatively complicated procedure and the number of plastic materials that can be plated with good results is limited.

In the case of metal casings, it is often difficult to obtain a uniformly distributed electric contact function along the casing joints. This problem is normally resolved by using metal fibre packing and closely placed screws, although this solution is neither cheap nor particularly reliable.

State-of-the-art techniques do not enable shielding casings made of metal foil/plastic foil laminates to be formed precisely in an inexpensive manner.

The forming of casings manufactured of pressed sheet metal is relatively limited and the tools used herefor are relatively expensive.

It is known to apply plastic foil in the injection tool of an injection-moulding apparatus when injection moulding apparatus casings, among others. The foil may be provided with decorative print and a surface structure which will have an aesthetic effect on the surfaces of the apparatus. It is also known to use wood veneer inserts to the same end.

When attempting to apply these principles with simple metal foils, it has been found that the plastic moulding material will not adhere to the metal foil or, when using plastic material that is able to bind to the metal foil, the whole workpiece tends to fasten in the mould. Furthermore, metal foils of such thinness as to enable the foils to be formed easily in an injection-moulding operation are too delicate to withstand the large sheer forces that occur during the course of the injection-moulding operation.

In summary, it can be said that none of the established methods is compatible with the desire for uniformly distributed effective electrical conductivity, the establishment of effective electric contact along joints, precise forming of the casings and the desire for a simple and quick method of manufacture.

SUMMARY OF THE INVENTION

The present invention relates to a method of injection-moulding electrically shielding casings, and the object of the method is to solve the aforesaid problems associated with established techniques.

The method comprises injection-moulding a mechanically supporting plastic structure onto a metal-foil/plastic laminate. The injection-moulded plastic structure is applied to one side of the laminate and the laminate is formed against the opposite side of the injection-moulding tool by virtue of the pressure exerted by the injected plastic moulding material.

The invention solves several problems, such as the problem of achieving evenly distributed and effective electrical conductivity in metal layers of sufficient thickness with regard to current penetration depth at the frequency concerned, and also the problem of achieving uniformly distributed electrical contact along joints (with the aid of the technique described in Swedish Patent Application 9300966-0), the problem of obtaining precise mechanical designs, and the problem of providing a rapid and simple method of manufacture that comprises few manufacturing steps.

Another advantage afforded by the inventive method is that it can be applied in equipment which after minor modifications will be well-established for the injection-moulding of plastic elements.

The invention will now be described in more detail with reference to a preferred exemplifying embodiment thereof and also with reference to the accompanying drawings.

DETAILED DESCRIPTION OF THE PREFERRED EMBODIMENT

An exemplifying embodiment of the invention is described below with reference to the accompanying drawings. The described and illustrated embodiment can be modified in different ways and the invention is limited solely by the scope of the accompanying claims.

Figure 1:
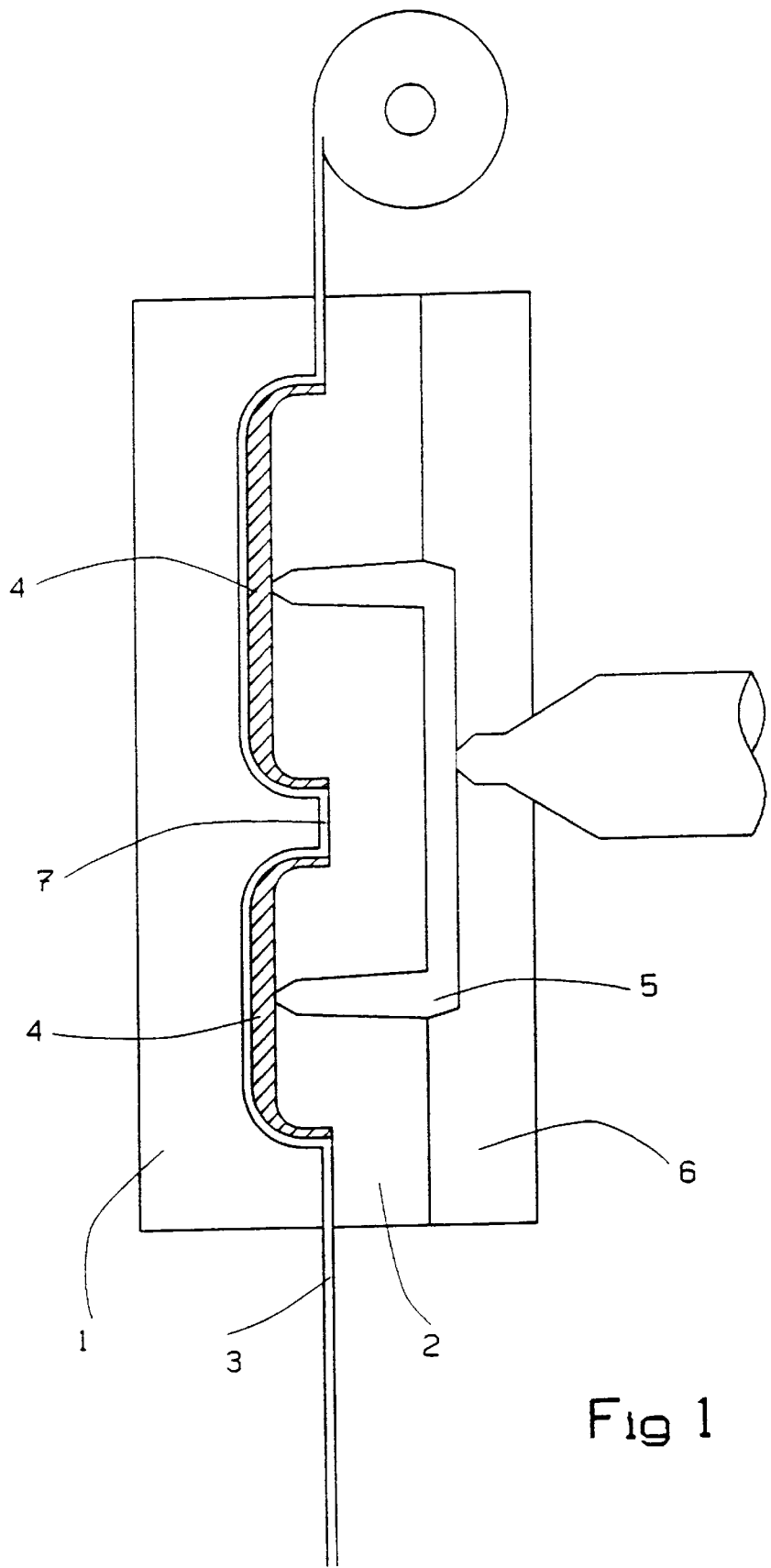
FIG. 1 is a cross-sectional view of an injection-moulding tool and shows the tool in one stage of operation with the mould closed and plastic compound injected into the mould. The shielding casing is produced in the tool in the form of two shells.

FIG. 1 is a sectional view of an injection-moulding tool which comprises a female mould-half 1 and a male mould-half 2. A foil-laminate strip 3 is clamped between the mould halves 1, 2. The Figure shows basin-like stiffenings 4 that have been injection-moulded on the foil laminate 3 through the inlet passage or ingate 5. A further ingate mould-part 6 is pressed against the male mould 2 and enables the ingate passage 5 to be ejected after each moulding operation in a manner usual when injection-moulding multiple elements. The moulded element thus comprises a foil laminate 3, which lies outermost on said element, and the injection-moulded basins 4, whereas certain parts 7 between respective basins 4 on the moulded element are comprised solely of the foil laminate 3.

Figure 2:
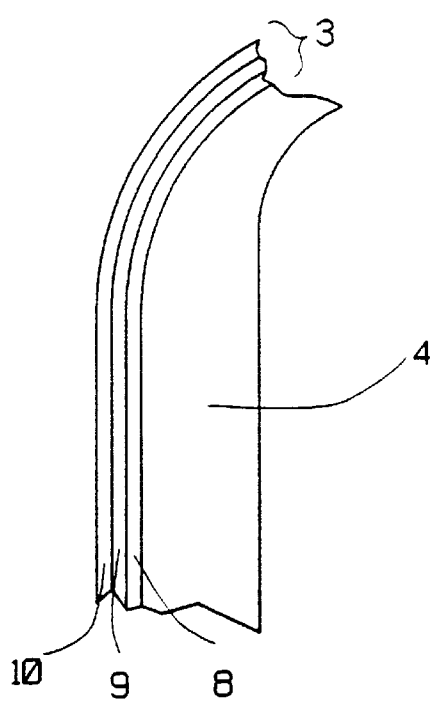
FIG. 2 is an enlarged cross-sectional view of part of a shielding casing that has been injection-moulded in accordance with the inventive method.

FIG. 2 is an enlarged cross-sectional view of one of the basin-like parts shown in FIG. 1. The plastic material 4 injected into the mould adheres to the foil laminate 3. The foil laminate 3 is comprised of the following layers, with the intention of obtaining desired properties.

Proximal to the injection-moulded plastic material 4 is a plastic foil layer 8 which is able to adhere to the plastic material 4. The inner foil layer or sheet 8 shall also be capable of being fusion-welded or glued to the circuit board (11) or to another foil laminate, as described below with reference to FIG. 3, and the joints are then made against those parts 7 of the capsule shown in FIG. 1 where the foil laminate is not covered by the injection-moulded plastic laminate 4. The foil sheet 8 that shall be capable of adhering to metalized earth surfaces on the circuit board is comprised of an ionomer resin, DuPont Surlyn® or Exxon Iotec®, which melts and forms chemical bonds with said surfaces when heated to 150–200° C.

Figure 3:
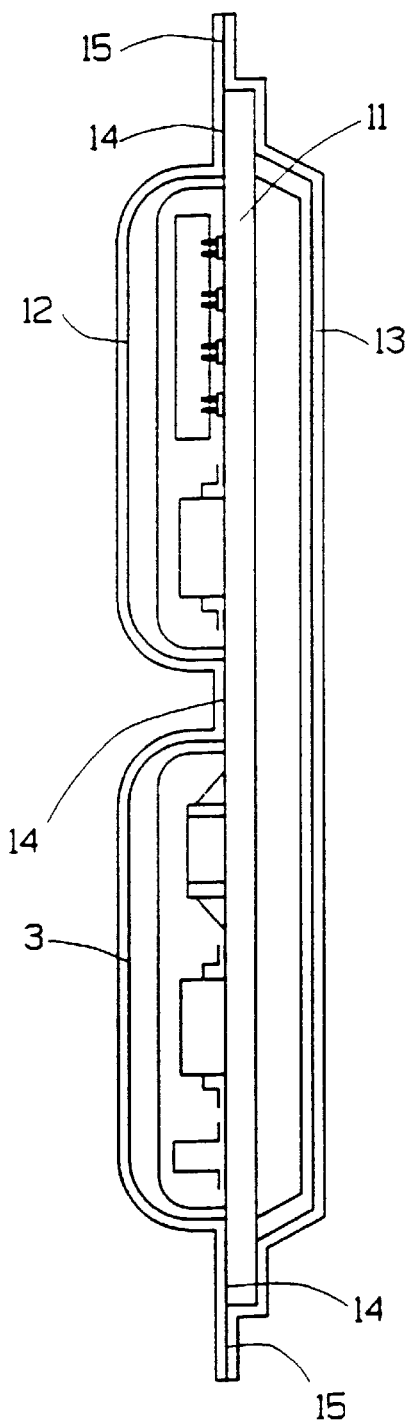
FIG. 3 is a cross-sectional view of a shielding casing that consists in an upper part which encloses two disparate circuit centres on a circuit board, and a bottom part that has been joined to the upper part.

The foil laminate 3 includes a central metal foil 9 and an outer plastic layer 10 which has properties that are favourable to the outer surface of the capsule, such as good corrosion-resistance and an attractive appearance, and may also be provided with information print, a decorative design, etc. The intermediate metal foil 9 contributes to the electrical shielding effect of the casing and to its imperviousness to the diffusion of gases. FIG. 3 illustrates a casing for shielding an electronic circuit 11. The casing is comprised of an upper part 12, which is constructed in accordance with the description given above with reference to FIGS. 1 and 2, and a bottom part 13. The upper part 12 is welded to the electronic circuit board 11 at those parts 14 which surround respective basins, and to the bottom part 13 at those regions 15 where the top and bottom parts abut one another. Electrical contact devices are also pressed into the locations 14, 15 at which the casing is welded (in accordance with Swedish Patent Application 9300966-0), these electrical contact devices establishing an electric contact between the metal foil of the foil laminate 3 and the earth plane of the circuit board 11 and the top and bottom parts of the casing 12, 13, thereby providing an effective screen against electromagnetic radiation while protecting the electronics 11 hermetically against the surrounding environment.

Figure 4A:
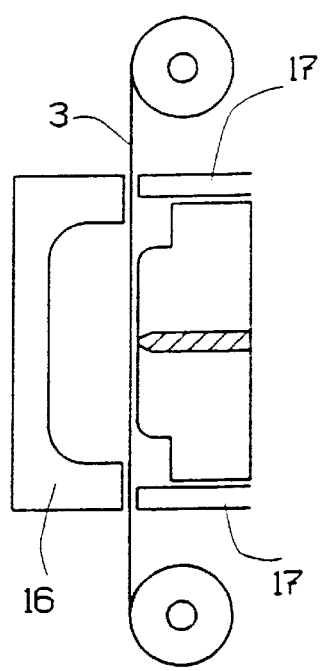
FIG. 4 illustrates three stages of operation in accordance with the inventive method: a) An open tool and a laminate held therein; b) a closed tool and the laminate partially deep drawn; c) injection of plastic compound completed and the laminate finally formed.
Figure 4B:
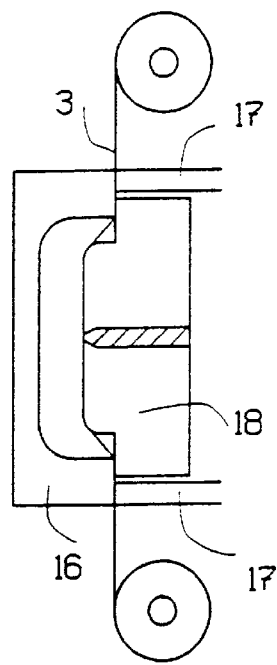
Figure 4C:
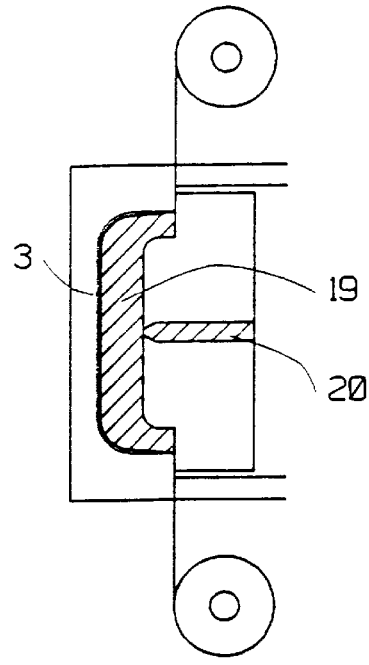

FIG. 4 is a sectional view of the moulding tool and shows the different stages of operation:

a) Shows the foil laminate 3 stretched against the female mould 16 and affixed thereto by means of a holder frame 17 which is pressed hard against the foil laminate 3 and the female mould 16.

b) The male mould 18 is shown pressed into the female mould 16 and the foil laminate 3 deep-drawn into said mould. In its innermost position, the foil laminate is clamped between the edge of the male mould 18 and the female mould 16, this clamping force being additional to the holding force generated by the holding frame 17. In this stage of the operation, the foil laminate 3 is partially deep-drawn to its final position in the mould.

c) In this view, thermoplastic material 19 has been injected through the ingate passage 20 and onto the foil laminate 3, which is therewith deep-drawn to its final state at the same time as a mechanically stable plastic structure 19 of precise measurements is formed, this structure adhering to the inner surface of the foil laminate 3.

The mould halves 16, 18 are then opened and the moulded element is ejected in a manner standard with injection moulding operations.

In summary, it can be said that a number of desirable properties are afforded by the aforedescribed method of combining injection-moulded stiffenings 4 with a foil laminate 3 which comprises a plastic foil 8 that can be fusion-welded to metal surfaces and to a thermoplastic material when injection-moulded, a metal foil 9 which provides a metallic layer of even thickness, and an outer plastic layer 10 which provides a surface of desired properties, such as corrosion-resistant and fire-retardant properties. Furthermore, because the aforesaid combination is achieved in a relatively simple and quick injection-moulding operation and provides mechanical stability and precision, there is realized a unique combination of properties that can be implemented with rational methods.

An example of these properties are effective shielding of electromagnetic radiation, even at high frequencies, a light and inexpensive construction, gas-diffusion impermeability; and manufacturing procedures that can be rapidly carried out.

The foil laminate 3 has a toughness in the surface plane which enables the metal foil 9 to be stretched uniformly in the deep-drawing process. The plastic layers or sheets 8, 10 also contribute towards a high tensile strength, which is important in view of the fact that the folio laminate 3 shall be capable of withstanding the mechanical strain to which it is subjected in the injection-moulding process.

It will be understood that the invention is not restricted to the aforedescribed and illustrated exemplifying embodiment thereof and that modifications can be made within the scope of the following claims.

We claim:

1. A method of manufacturing a plastic electric shielding casing for at least partially enclosing electrical equipment, said method comprising the steps of:

enclosing in an injection-moulding tool a foil laminate, the foil laminate including two plastic layers and an intermediate metal foil;

injecting a plastic material into the tool onto one of the plastic layers of the foil laminate, so that the foil laminate is deep-drawn into the tool, the plastic material forming a plastic structure with at least one of said plastic layers adhering to said plastic structure so as to form a plastic element which includes the foil laminate and the plastic structure, wherein a certain part of the plastic element includes only the foil laminate; and attaching the certain part of the plastic element to one of a circuit board containing the electrical equipment and another foil laminate in another part of the shielding casing.

2. A method according to claim 1, wherein the injected plastic material is a thermoplastic resin.

3. A method according to claim 2, wherein the at least one of the plastic layers adhered to the plastic structure is an ionomer resin.

4. A method according to claim 1, wherein the step of attaching the certain part of the plastic element includes gluing.

5. A method according to claim 1, wherein the step of attaching the certain part of the plastic element includes fusion-welding.

6. A method according to claim 1, wherein the certain part of the plastic element is located adjacent to a periphery of the plastic structure.

7. A method according to claim 1, wherein the plastic element includes a plurality of plastic structures and the certain part of the plastic element is located between the plurality of the plastic structures.

8. The method according to claim 7, wherein the plastic structures are basin-shaped.

9. The method according to claim 1, wherein the certain part is attached to the circuit board.

10. A method according to claim 1, wherein the certain part is a portion of the foil laminate extending away from the plastic structure, wherein none of the two plastic layers and the intermediate metal foil at the certain part is in direct contact with the plastic structure.

11. A method according to claim 1, wherein the plastic structure includes two basin-shaped plastic stiffenings, the certain part being a portion of the foil laminate located between the two basin-shaped plastic stiffenings.

12. A method according to claim 1, wherein the certain part is a projection of the foil laminate having one end adhered to the plastic structure and another end distant from the plastic structure.

13. A method according to claim 1, wherein the certain part is directly attached to one of the circuit board and the another foil laminate.

* * * * *